(12) United States Patent
van Winkelhoff et al.

(10) Patent No.: US 8,355,293 B2
(45) Date of Patent: Jan. 15, 2013

(54) RETENTION VOLTAGE GENERATION

(75) Inventors: Nicolaas Klarinus Johannes van Winkelhoff, Villard-Bonnot (FR); Sebastien Nicolas Ricavy, Saint Martin d'Heres (FR)

(73) Assignee: ARM Limited, Cambridge (GB)

( * ) Notice: Subject to any disclaimer, the term of this patent is extended or adjusted under 35 U.S.C. 154(b) by 120 days.

(21) Appl. No.: 12/926,650

(22) Filed: Dec. 1, 2010

(65) Prior Publication Data
US 2012/0140585 A1    Jun. 7, 2012

(51) Int. Cl.
*G11C 7/00*    (2006.01)
(52) U.S. Cl. .................... 365/226; 365/228; 365/189.09
(58) Field of Classification Search ................... 365/226, 365/228, 189.09, 154, 156
See application file for complete search history.

(56) References Cited

U.S. PATENT DOCUMENTS
7,474,582 B2 *    1/2009    Mair et al. .................... 365/226

* cited by examiner

*Primary Examiner* — David Lam
(74) *Attorney, Agent, or Firm* — Nixon & Vanderhye P.C.

(57) ABSTRACT

An integrated circuit and method includes retention voltage generation circuitry which receives a supply voltage from a supply voltage node and provides a retention voltage. Functional circuitry is connected between the retention voltage node and a reference voltage node and is held in a data retention state when at least a minimum voltage is provided between the retention voltage node and the reference voltage node. Each of the circuits includes at least one p-type threshold device and at least one n-type threshold device, both having a characteristic threshold voltage. The p-type and n-type threshold devices are connected in parallel between the supply voltage node and the retention voltage node. A variation in the characteristic threshold voltage of either of the at least one p-type or the at least one n-type device maintains at least the minimum voltage between the retention voltage node and the reference voltage node.

23 Claims, 5 Drawing Sheets

| Corner | Vret N+Pdiode | Vret Pdiode |
|---|---|---|
| tt_0.850/25°C | 0.76 | 0.74 |
| ff_0.935/-40°C | 0.82 | 0.79 |
| ff_0.935/125°C | 0.78 | 0.72 |
| ss_0.765/-40°C | 0.66 | 0.64 |
| ss_0.765/125°C | 0.69 | 0.67 |
| sf_0.765/-40°C | 0.69 | 0.69 |
| sf_0.765/125°C | 0.67 | 0.66 |
| fs_0.765/-40°C | 0.69 | 0.59 |
| fs_0.765/125°C | 0.64 | 0.54 |
| sf_0.935/-40°C | 0.84 | 0.84 |
| sf_0.935/125°C | 0.82 | 0.82 |
| fs_0.935/-40°C | 0.84 | 0.74 |
| fs_0.935/125°C | 0.79 | 0.70 |

RETENTION VOLTAGE GENERATION

BACKGROUND OF THE INVENTION

1. Field of the Invention

The present invention relates to retention voltage generation in an integrated circuit. More particularly, this invention relates to the provision of a retention voltage which is stable against variations in characteristic threshold voltages of threshold devices in the integrated circuit.

2. Description of the Prior Art

The provision of a retention voltage in an integrated circuit can be used to hold components of that integrated circuit in a data retention state. For example, in a memory device, it may be desired to power down as much as possible of the memory device (for example switching off associated access circuitry) whilst reducing the voltage applied to the bitcells of the memory to a level at which information stored therein can be maintained, but keeping that voltage as low as possible to avoid power consumption through current leakage. Given that the power consumption of such advice can be logarithmic with the voltage applied, there is great motivation to provide as low a retention voltage as possible. Nevertheless, this retention voltage must be stable, such that fluctuations do not cause data loss.

Nevertheless, in the manufacture of such integrated circuits, whilst the manufacturers of such integrated circuits strive to produce the components devices of the integrated circuit within tight tolerances, some "process variations" are inevitable. In the context of the provision of a retention voltage within an integrated circuit, these process variations can lead to fluctuations in the characteristic threshold voltage of the components of the integrated circuit, which may result in variations in the retention voltage, thus risking data loss.

A relatively stable retention voltage may be provided within an integrated circuit by means of a band gap voltage regulator. However, such devices have high power consumption, and are both relatively large and complex. It would be preferable to provide a small and dense component for the provision of the retention voltage which is simply implemented and does not consume too much area.

A simple technique which is known for the provision of a retention voltage is to provide a small PMOS diode between a supply voltage node and a retention voltage node of the integrated circuit. However, it has been found that such devices can suffer from problems in corner cases of process variations, in particular when the integrated circuit comprises both PMOS and NMOS components. Most notably, particular cross corners of process variations for these components (e.g. slow-fast or fast-slow) can result in undesirably large leakage current within the components supplied with the retention voltage, leading to an increased voltage drop across the PMOS diode and hence a reduction in the supplied retention voltage. If this reduction is allowed to become too great, the data retention of the functional circuitry may fail.

Consequently, it would be desirable to provide an improved technique for providing a retention voltage in an integrated circuit which addresses the above described problems.

SUMMARY OF THE INVENTION

Viewed from a first aspect, the present invention provides an integrated circuit comprising: a supply voltage node and a retention voltage node; retention voltage generation circuitry configured receive a supply voltage from said supply voltage node and to provide a retention voltage at said retention voltage node; and functional circuitry connected between said retention voltage node and a reference voltage node, said functional circuitry configured to be held in a data retention state when at least a minimum voltage is provided between said retention voltage node and said reference voltage node, each of said functional circuitry and said retention voltage generation circuitry comprising at least one p-type threshold device and at least one n-type threshold device, said p-type threshold devices and said n-type threshold devices respectively having a characteristic threshold voltage, wherein said at least one p-type threshold device and said at least one n-type threshold device in said retention voltage generation circuitry are connected in parallel between said supply voltage node and said retention voltage node, wherein a variation in said characteristic threshold voltage of either said at least one p-type threshold device or said at least one n-type threshold device in said functional circuitry, is accompanied by a corresponding variation in said characteristic threshold voltage of either said at least one p-type threshold device or said at least one n-type threshold device respectively in said retention voltage generation circuitry, thus maintaining at least said minimum voltage between said retention voltage node and said reference voltage node and thus keeping said functional circuitry in said data retention state.

Accordingly, in an integrated circuit in which the functional circuitry comprises both p-type threshold devices and n-type threshold devices, retention voltage generation circuitry is provided comprising at least one p-type threshold device and at least one n-type threshold device connected in parallel between a supply voltage node and a retention voltage node. The functional circuitry itself is connected between the retention voltage node and a reference voltage node. The retention voltage node provides the functional circuitry with a retention voltage, such that at least a minimum voltage required to hold the functional circuitry in a data retention state is provided between the retention voltage node and a reference voltage node.

The provision of both a p-type threshold device and an n-type threshold device arranged in parallel in the retention voltage generation circuitry means that if a variation in the characteristic threshold voltage of either the p-type threshold devices or the n-type threshold devices in the integrated circuit as a whole occurs, a corresponding variation in the characteristic voltage within the retention voltage generation circuitry (in either the p-type threshold device or the n-type threshold device which are arranged therein in parallel) results, thus helping to ensure at least the minimum voltage between the retention voltage node and the reference voltage node is maintained. The functional circuitry is thus maintained in its data retention state.

Variations in the characteristic threshold voltages of the p-type threshold devices or the n-type threshold devices in the integrated circuit could result in various changes in the way the integrated circuit operates, but in one embodiment said variation in said characteristic threshold voltage of either said at least one p-type threshold device or said at least one n-type threshold device in said functional circuitry results in an increase in leakage current in said functional circuitry, and said corresponding variation in said characteristic threshold voltage of either said at least one p-type threshold device or said at least one n-type threshold device respectively in said retention voltage generation circuitry results in an increase in current through said retention voltage generation circuitry. For example, a lowering of the characteristic voltage threshold of a p- or n-type threshold device in the functional circuitry can cause that device to become "faster" (i.e. switching more easily), which overall may result in an increase in leakage current in the functional circuitry. This increase in leakage current could drag down the retention voltage being provided at the retention voltage node, potentially below the minimum voltage required to keep the functional circuitry in its data retention state. However, because of the presence of the same p- and n-type threshold devices in the retention voltage generation circuitry, and in particular those p- and n-type threshold devices in the retention voltage generation circuitry being arranged in parallel, a corresponding increase in current through said retention voltage generation circuitry also occurs, counteracting the effect of the functional circuitry leakage current on the retention voltage.

It will be appreciated that the retention voltage generation circuitry may be arranged either "above" or "below" the functional circuitry with respect to the voltages provided for operating the integrated circuit. Hence, in one embodiment said supply voltage node is at a higher voltage than said reference voltage node. For example, the supply voltage node might be set at 1V, the reference voltage node might be set at 0V, the retention voltage being set at 0.7V to give a voltage across the functional circuitry of 0.7V. In another embodiment, said supply voltage node is at a lower voltage than said reference voltage node. For example, the supply voltage node might be set at 0V, the reference voltage node might be set at 1V, the retention voltage being set at 0.3V to give a voltage across the functional circuitry of 0.7V.

It will appreciated that a variation in the characteristic threshold voltage could occur due to a number of reasons, but in one embodiment the variation in said characteristic threshold voltage results from variations in a manufacturing process of said integrated circuit. Whilst in the fabrication of such integrated circuits it is sought to provide such p-type threshold devices and n-type threshold devices which vary in their characteristics as little as possible, some variation in the characteristic threshold voltage of these devices is inevitable, and it is advantageous if the generation of the retention voltage within such an integrated circuit is stable with respect to such variations. In another embodiment, said variation in said characteristic threshold voltage results from temperature variations of said integrated circuit. That is to say, once manufactured the characteristic threshold voltage of the p-type and n-type threshold devices in the integrated circuit may still vary in dependence on the temperature of the integrated circuit and it is advantageous if the generation of the retention voltage within the integrated circuit is stable against these variations.

It will appreciated that the at least one p-type threshold device and the at least one n-type threshold device in the retention voltage generation circuitry may take a number of forms, but in one embodiment said at least one p-type threshold device and said at least one n-type threshold device in said retention voltage generation circuitry are p-type and n-type diodes respectively. Configuring the retention voltage generation circuitry in this manner provides an advantageously compact method of bringing about the necessary voltage drop between the supply voltage node and the retention voltage node, which does not consume a great deal of area on the integrated circuit and has a modest power consumption.

These diodes could take a number of forms, but in one embodiment said p-type and n-type diodes comprise p-type and n-type transistors with their gates coupled to their drains. This technique for providing a diode from a transistor component is not only easily implemented, but in the context of the fabrication of an integrated circuit provides an advantageous re-use of transistors which will typically be used in many locations within the integrated circuit. This re-use not only simplifies the fabrication process, but also is also ensures that the variations in the characteristic threshold voltages of the devices in the functional circuitry will be closely mirrored by the variations in the characteristic threshold voltages of the devices in the retention voltage generation circuitry.

In one embodiment said p-type threshold devices are PMOS threshold devices and said n-type threshold devices are NMOS threshold devices. In one such embodiment, said PMOS threshold devices are PMOS transistors and said NMOS threshold devices are NMOS transistors.

It will be recognised that various combinations of variation in the characteristic threshold voltages of the p-type and the n-type threshold devices can occur, but it has been found that it is the cross-corner cases which may be most problematic when seeking to provide a stable retention voltage. Consequently, in one embodiment said variation in said characteristic threshold voltage of either said at least one p-type threshold device or said at least one n-type threshold device comprises an upwards variation in said characteristic threshold voltage of said at least one p-type threshold device and a downwards variation in said characteristic threshold voltage of said at least one n-type threshold device. Conversely in another embodiment said variation in said characteristic threshold voltage of either said at least one p-type threshold device or said at least one n-type threshold device comprises an upwards variation in said characteristic threshold voltage of said at least one n-type threshold device and a downwards variation in said characteristic threshold voltage of said at least one p-type threshold device.

There are a number of functional circuits which can benefit from the techniques described herein, but in one embodiment said functional circuitry comprises a memory. A memory may particularly benefit from the provision of a stable retention voltage, since the data stored therein may be retained, whilst the power consumption of the memory is reduced as far as possible when it is in its data retention state.

The memory may be configured in various ways, but in one embodiment said at least one p-type threshold device and at least one n-type threshold device in said functional circuitry form part of a memory bitcell.

In one embodiment, said memory is a RAM. The volatility of RAM devices means that it is necessary to provide a retention voltage if it is desired to maintain the data stored therein.

The retention voltage generation circuitry may be modular and repeated, such that said retention voltage generation circuitry comprises a plurality of pairs of p-type and n-type threshold devices connected in parallel between said supply voltage node and said retention voltage node. In such a modular embodiment, it is advantageous if the retention voltage generation circuitry is provided in a simply and easily repeatable manner.

In one embodiment said p-type threshold devices and said n-type threshold devices in said functional circuitry and said retention voltage generation circuitry are similarly sized devices. Accordingly, according to the present techniques there is no need for the retention voltage generation circuitry to comprise threshold devices which are significantly different in size from those provided in functional circuitry, which is advantageous in the provision of an easily manufactured layout of an integrated circuit.

The functional circuitry may take a number of forms which may benefit from the provision of a retention voltage to hold them in a data retention state and in one embodiment said functional circuitry comprises a retention flip flop. In another embodiment said functional circuitry comprises a retention latch.

Viewed from a second aspect the present invention provides an integrated circuit comprising: a supply voltage node and a retention voltage node; retention voltage generation means for receiving a supply voltage from said supply voltage node and for providing a retention voltage at said retention voltage node; and functional circuitry means connected between said retention voltage node and a reference voltage node, said functional circuitry means configured to be held in a data retention state when at least a minimum voltage is provided between said retention voltage node and said reference voltage node, each of said functional circuitry means and said retention voltage generation means comprising at least one p-type threshold device and at least one n-type threshold device, said p-type threshold devices and said n-type threshold devices respectively having a characteristic threshold voltage, wherein said at least one p-type threshold device and said at least one n-type threshold device in said retention voltage generation circuitry are connected in parallel between said supply voltage node and said retention voltage node, wherein a variation in said characteristic threshold voltage of either said at least one p-type threshold device or said at least one n-type threshold device in said functional circuitry means, is accompanied by a corresponding variation in said characteristic threshold voltage of either said at least one p-type threshold device or said at least one n-type threshold device respectively in said retention voltage generation means, thus maintaining at least said minimum voltage between said retention voltage node and said reference voltage node and thus keeping said functional circuitry means in said data retention state.

Viewed from a third aspect, the present invention provides a method of supplying a retention voltage to functional circuitry in an integrated circuit, said integrated circuit comprising a supply voltage node and a retention voltage node, said method comprising the steps of: providing retention voltage generation circuitry configured receive a supply voltage from said supply voltage node and to provide a retention voltage at said retention voltage node; providing functional circuitry connected between said retention voltage node and a reference voltage node, said functional circuitry configured to be held in a data retention state when at least a minimum voltage is provided between said retention voltage node and said reference voltage node, each of said functional circuitry and said retention voltage generation circuitry comprising at least one p-type threshold device and at least one n-type threshold device, said p-type threshold devices and said n-type threshold devices respectively having a characteristic threshold voltage; and connecting said at least one p-type threshold device and said at least one n-type threshold device in said retention voltage generation circuitry in parallel between said supply voltage node and said retention voltage node, wherein a variation in said characteristic threshold voltage of either said at least one p-type threshold device or said at least one n-type threshold device in said functional circuitry, is accompanied by a corresponding variation in said characteristic threshold voltage of said at least one p-type threshold device or said at least one n-type threshold device respectively in said retention voltage generation circuitry, thus maintaining at least said minimum voltage between said retention voltage node and said reference voltage node and thus keeping said functional circuitry in said data retention state.

Viewed from a fourth aspect the present invention provides a computer readable storage medium storing in a non-transient format a computer program configured to cause a computer to carry out the method according to the third aspect of the invention.

Viewed from a fifth aspect the present invention provides a computer readable storage medium storing in a non-transient format a library configured to provide an integrated circuit according to the first aspect.

BRIEF DESCRIPTION OF THE DRAWINGS

The present invention will be described further, by way of example only, with reference to embodiments thereof as illustrated in the accompanying drawings, in which.

DESCRIPTION OF THE PREFERRED EMBODIMENTS

Figure 1:
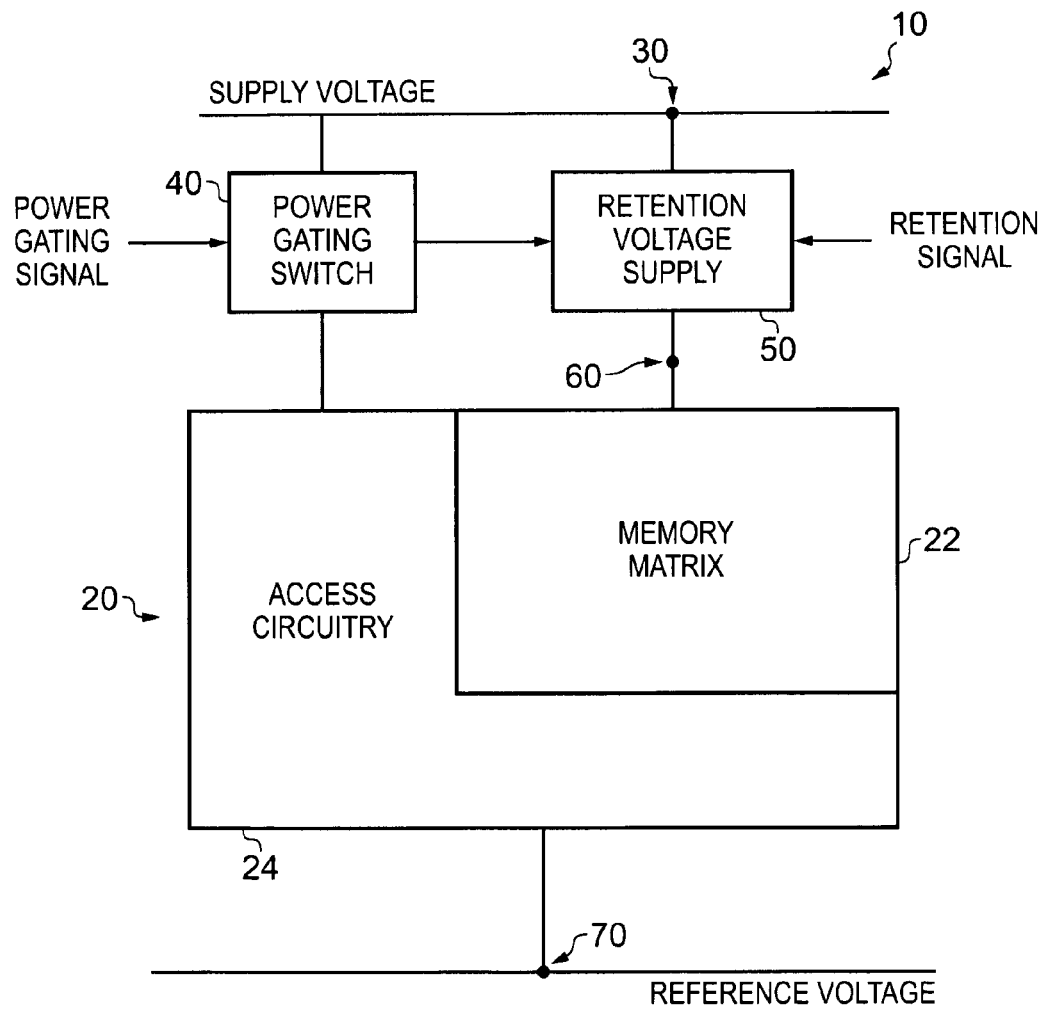
FIG. 1 schematically illustrates an integrated circuit according to one embodiment.

FIG. 1 schematically illustrates an integrated circuit 10 according to one embodiment. This integrated circuit comprises a memory device 20 which is formed from a memory matrix 22 and access circuitry 24, the access circuitry 24 being used to read and write data to and from the bitcells of the memory matrix 22. The memory 20 derives its power from a supply voltage provided at a supply voltage node 30. In this example the supply voltage node is at approximately 1V. When the memory device 20 is fully powered, the supply voltage is provided to the memory device 20 via power gating switch 40 in dependence on a power gating signal. However, when the memory device is put into its data retention state, the power gating signal is switched off, which causes the power gating switch 40 to cut off the supply voltage from the access circuitry 24. If the memory device 20 is to be put into its data retention state, a retention signal enables the retention voltage supply 50, which is configured to receive the supply voltage from the supply voltage node 30 and to provide a lower retention voltage at the retention voltage node 60. In this example the retention voltage node is at approximately 0.7V. This retention voltage is configured to be as low as possible, to save as much power as possible, whilst being above the minimum voltage necessary to maintain the memory matrix 22 in its data retention state. Memory device 20 is also connected to reference voltage node 70, which in this example is at approximately 0V. The bitcells of memory matrix 22 are formed from combinations of p-type and n-type threshold devices, whilst the retention voltage supply 50 is formed from at least one p-type threshold device and at least one n-type threshold device connected in parallel between supply voltage node 30 and retention voltage node 60, as will be discussed in more detail with reference to FIG. 2.

Figure 2:
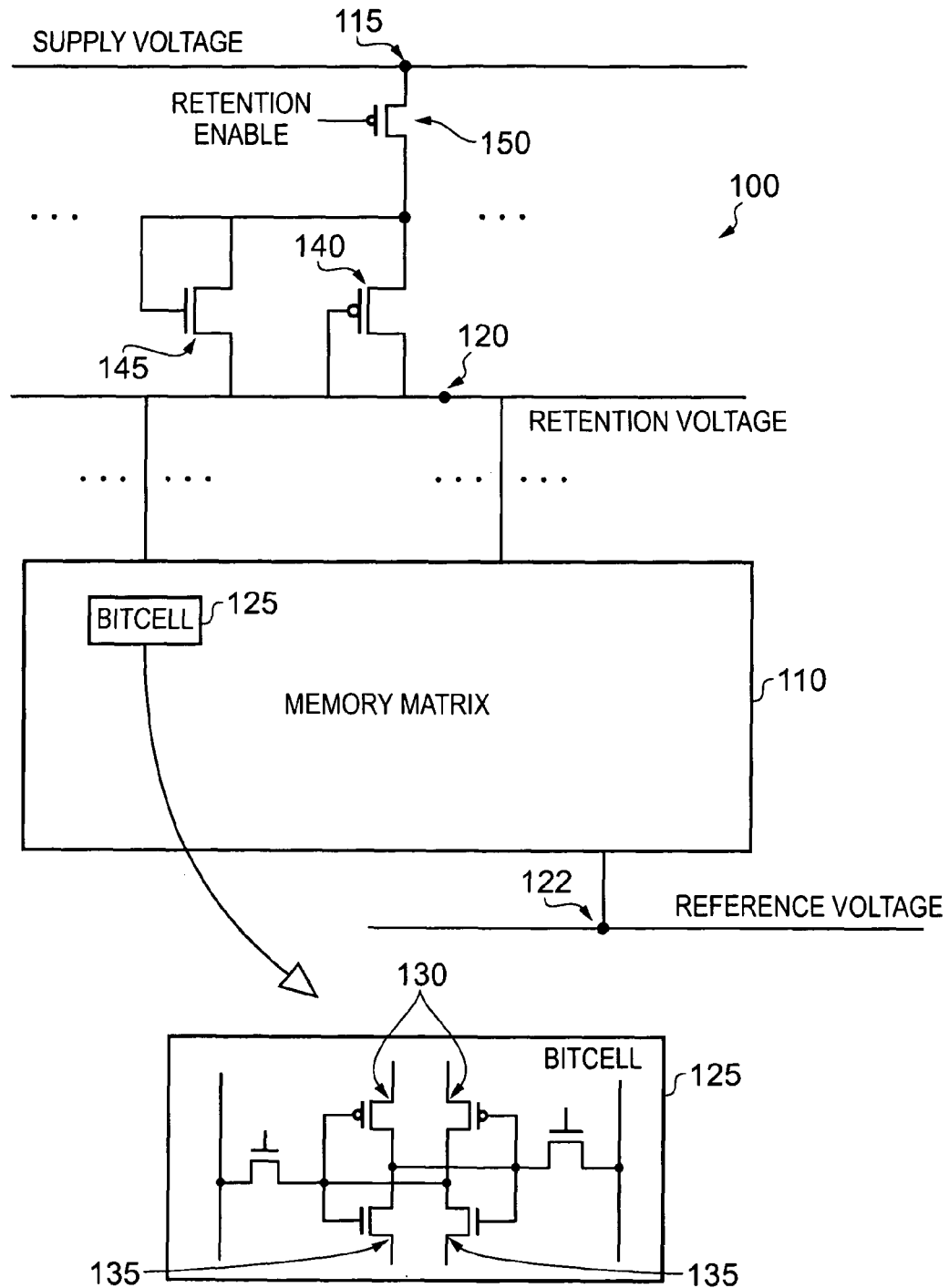
FIG. 2 schematically illustrates retention voltage generation circuitry and a memory matrix in one embodiment.

FIG. 2 schematically illustrates in more detail the configuration of a retention voltage supply 100 and memory matrix 110 according to one embodiment. The retention voltage generation circuitry 100 is connected to the supply voltage node 115 and to the retention voltage node 120. The memory matrix 110 is connected between the retention voltage node 120 and the reference voltage node 122, in order to supply its bitcells with the minimum voltage necessary to maintain its data retention state. An example bitcell 125 is illustrated in more detail.

Each bitcell 125 comprises two PMOS transistors 130 and two NMOS transistors 135, these being connected as illustrated in the familiar manner to provide a memory bitcell which can be held in one of two stable states, representing a logical '1' and a logical '0'.

The retention voltage generation circuitry 100 comprises a PMOS transistor 140 and an NMOS transistor 145, these being connected in parallel between the supply voltage node 115 and the retention voltage node 120. A further switch 150 is provided, responsive to the retention enable signal, to turn the retention voltage generation circuitry on and off. Each of the PMOS transistor 140 and the NMOS transistor 145 are configured as diodes, with their gates coupled to their drains. The PMOS transistor 140 and the NMOS transistor 145 are a similar size to the PMOS transistors 130 and NMOS transistors 135 respectively. In the illustrated example embodiment the PMOS transistor 140 is sized as 2 μm/30 nm and the NMOS transistor 145 is sized as 1 μm/30 nm.

Although only one p-diode/n-diode pair is illustrated in FIG. 2, in some embodiments the memory matrix 100 may be supplied with the retention voltage via multiple such pairs, these all being connected in parallel between the supply voltage node 115 and the retention voltage node 120. This may in particular be the case if the memory matrix is generated in a modular fashion with a retention voltage generation diode pair such as that illustrated being provided at the head of each memory matrix module.

When the integrated circuit illustrated in FIG. 2 is implemented, having been set up with a particular configuration of components in accordance with the system designer's wishes, there may nevertheless occur variations in the characteristic threshold voltages of the PMOS threshold devices and the NMOS threshold devices. This variation may be transitory, such as a temperature variation in the environment of the integrated circuit, causing the characteristic threshold voltages to change. Alternatively, this variation may be more permanent in the sense of a deviation from the design-selected characteristic threshold voltages of the components, resulting from process variation in the fabrication of this integrated circuit. Either way, this variation in the characteristic threshold voltage of the PMOS threshold device and/or the NMOS threshold device in the functional circuitry can result in a change in the leakage current in the memory matrix 110 when the memory matrix 110 is put into its data retention state. An increase in the leakage current from the bitcells 125 of the memory matrix 110 has, prior to the techniques of the present technology, the potential to cause a drop in the retention voltage provided at the retention voltage node 120. This is because, for example if only a PMOS diode were provided in the retention voltage generation circuitry to cause the required voltage drop from the supply voltage node 115 to the retention voltage node 120, a variation in the characteristic threshold voltage of the NMOS threshold devices 135 in the bitcells 125 would increase the leakage current from the memory matrix 110, pulling down the voltage at the retention voltage node 120. If this reduction in the retention voltage were able to be too great, the retention voltage might fall below the minimum voltage necessary to hold the memory matrix in its retention state and data could be lost.

However, by the provision of both the p-type diode 140 and the n-type diode 145 in the retention voltage generation circuit 100, any variation in the characteristic threshold voltage of the PMOS and/or NMOS threshold devices 130, 135 will be accompanied by a corresponding change in the characteristic threshold voltage of the PMOS and/or NMOS threshold devices 140, 145 in the retention voltage generation circuitry. Hence, in the above described example where the leakage current increases in the memory matrix, an increased current flow will also occur through the retention voltage generation circuitry 100, thus maintaining the retention voltage at the retention voltage node 120.

Figures 3A, 3B:
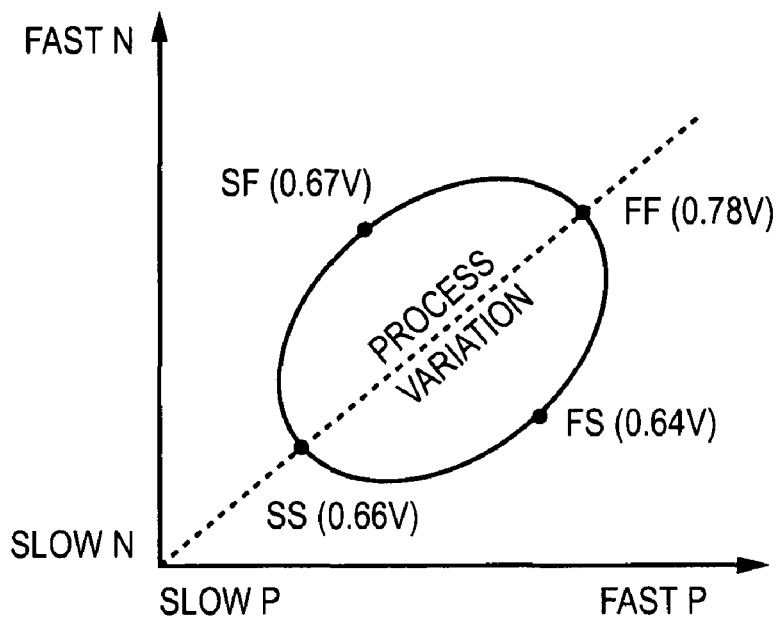
FIG. 3a illustrates some corner cases resulting from process variation in the manufacture of PMOS and NMOS threshold devices.
FIG. 3b shows the result of a simulation of the retention voltage resulting from various process and temperature variations.

FIG. 3a graphically illustrates how the performance of p-type and n-type threshold devices (in this example PMOS and NMOS devices) may vary as a result of the fabrication process variation. This variation may result in a threshold device being "faster" (i.e. having a lower characteristic threshold voltage and therefore switching more easily) or "slower" (i.e. having a higher characteristic threshold voltage and therefore switching less easily). The ellipse shown in FIG. 3a represents the outer limits (at 3σ) for the processor variation expected in the fabrication process of these p-type and n-type threshold devices. Such limits are typically provided to the system designer by the fabrication plant (a.k.a. "fab"), allowing the system designer to set out an integrated circuit design which should operate within specification despite these process variations. The four corner cases illustrated in FIG. 3a are slow-slow (SS), fast-slow (FS), fast-fast (FF) and slow-fast (SF), referring to the p-type devices and the n-type devices respectively. The voltage values given in brackets refer to the corresponding lowest expected retention voltages for these corner cases as is discussed in more detail below with reference to FIG. 3b. It should be noted that the process variation illustrated in FIG. 3a is elliptical and not circular (as might be expected if the p-type variation and the n-type variation were independent of one another), but due to some features of the fabrication process, there is a degree of correlation between the variations. It should also be noted that it is the cross corner cases (namely FS and SF) which are most problematic for the prior art type of retention voltage generation circuitry comprising only a p-type diode, since these represent the extremes in performance difference between the p-type and n-type devices, and therefore the greatest potential for characteristic threshold variation of, say, the n-type devices in a functional circuit to cause variations in the generated retention voltage.

In FIG. 3b a set of simulation data is given for various corner cases (in terms of both p/n-type speed and temperature) and the resulting effect on the retention voltage (Vret). Variations in the supply voltage are also shown. As before the letters "s" and "f" refer to slow and fast respectively, whilst in the first row of the table "t" refers to "typical" values. In this first row the value 0.850 is the supply voltage and the temperature is 25° C. This results in a retention voltage of 0.76 volts using circuitry such as that described with respect to FIG. 2 and 0.74 volts using only a p-type diode.

The further data given represent an approximately 10% variation up or down in supply voltage and temperature extremes of from −40° C. to 125° C. Hence, for the process and temperature variations illustrated in the "corner" column, it can be seen in the "P diode" column that a variation in the retention voltage within a range of 0.54 volts (at the FS corner and high temperature) to 0.84 volts (at the SF corner at low temperature) results. The deviation down to 0.54 volts is particularly problematic since a minimum retention voltage of approximately 0.6 volts is required for data retention. However, comparing to the middle "N +P diode" column, it can be seen that the range is reduced by 50%, now extending from 0.64V to 0.84V. Hence, it is in particular to be noted that the arrangement of the retention voltage generation circuitry described herein enables the retention voltage to be maintained above the minimum value of 0.6 volts for data retention. Referring back to FIG. 3a, the voltage values given in brackets after each corner case can be seen to correspond to the lowest retention voltage that can result for that corner case across the whole temperature range.

Hence, it can be seen from FIG. 3b that the approach described herein results in the system designer being able to rely on a retention voltage being generated in a more constrained range, thus allowing the upward variation in the retention voltage to be limited (and hence saving power) whilst ensuring that the lower limit does not fluctuate between the minimum voltage required to maintain the data retention state.

Although the embodiments described above have predominantly discussed in terms of particular embodiments using PMOS/NMOS devices, it should be appreciated that the techniques described are more generally applicable to integrated circuits using any p-type and n-type threshold devices.

Figure 4A:
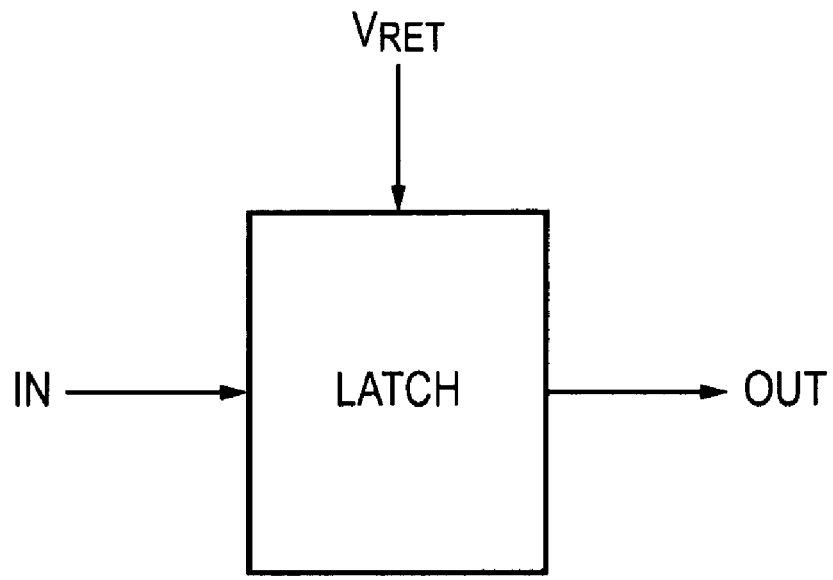
FIGS. 4a and 4b schematically illustrate a retention latch and retention flip flop respectively.
Figure 4B:
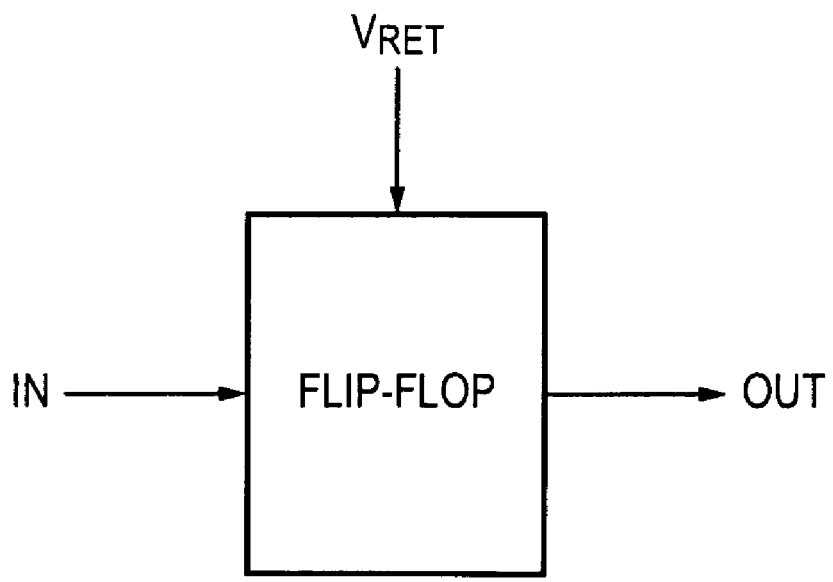

Although the embodiments described above have been set out in the context of a memory matrix having many bitcells therein, it will be appreciated that these techniques are not only applicable to a memory bitcell, but may be equally applied to any other circuitry component which requires the provision of a stable retention voltage in order for it to maintain a data retention state. For example FIG. 4a schematically illustrates a retention latch configured to receive an input value (IN) and to enter a data retention state when a retention voltage Vret is applied, so that the data value is held within the retention latch and may be later output (OUT) when the latch exits its data retention state returning to its full power state. Similarly, FIG. 4b schematically illustrates a retention flip flop which is similarly configured.

Figure 5A:
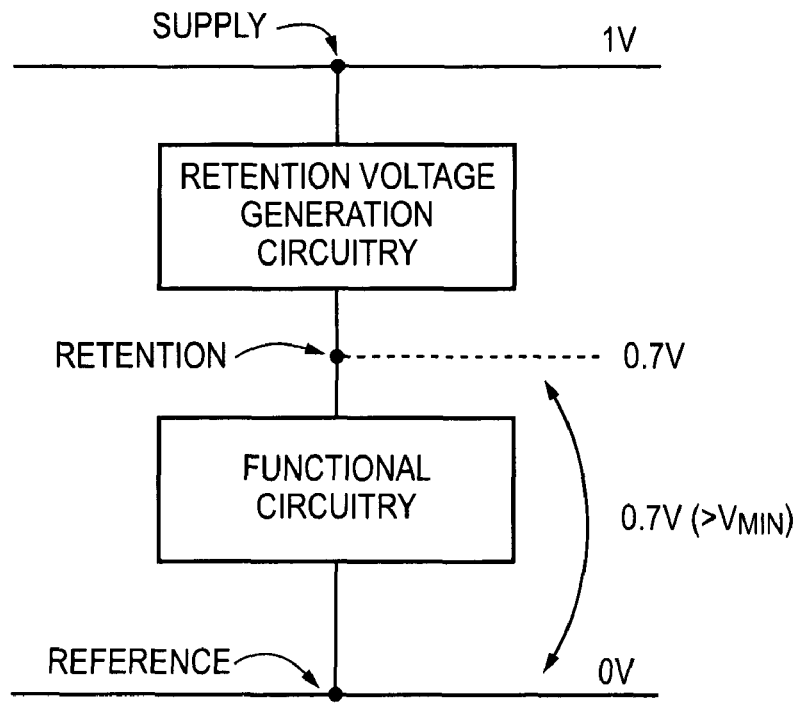
FIGS. 5a and 5b illustrate two alternative configurations of the supply voltage node, retention voltage node and reference voltage node with respect to the retention voltage generation circuitry and functional circuitry.
Figure 5B:
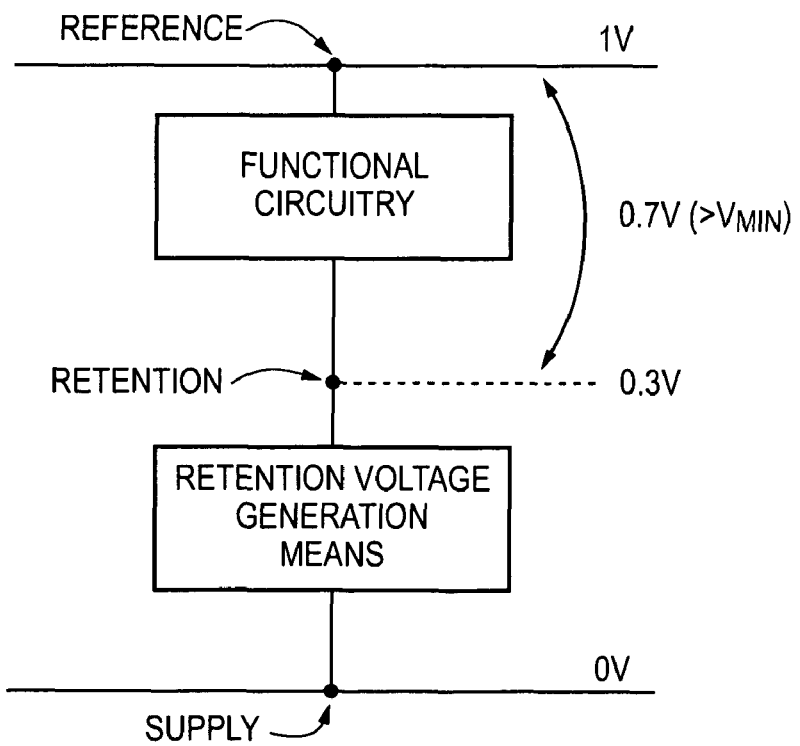

FIGS. 5a and 5b schematically illustrate two arrangements of an integrated circuit in corresponding embodiments. In both embodiments the functional circuitry requires a retention voltage of 0.7V and the voltage difference across the whole circuit is 1V. In the first embodiment (FIG. 5a) the supply voltage node is set at 1V, whilst the reference voltage node is set at 0V, the retention voltage generation circuitry providing the voltage drop from 1V to the retention voltage of 0.7V. In the second embodiment (FIG. 5b) the supply voltage node is set at 0V, whilst the reference voltage node is set at 1V, the retention voltage generation circuitry providing the voltage drop from 0.3V to the supply voltage of 0V.

An integrated circuit configured according to the techniques described herein may be provided to a manufacturer in the form of a computer program stored on a computer-readable storage medium, the computer program being configured to cause a computer to set out an integrated circuit as described above. For example, a library may be provided which is configured to provide the components that form such an integrated circuit.

Although particular embodiments of the invention have been described herein, it will be apparent that the invention is not limited thereto, and that many modifications and additions may be made within the scope of the invention. For example, various combinations of the features of the following dependent could be made with the features of the independent claims without departing from the scope of the present invention.

We claim:

1. An integrated circuit comprising:
a supply voltage node and a retention voltage node;
retention voltage generation circuitry configured receive a supply voltage from said supply voltage node and to provide a retention voltage at said retention voltage node; and
functional circuitry connected between said retention voltage node and a reference voltage node, said functional circuitry configured to be held in a data retention state when at least a minimum voltage is provided between said retention voltage node and said reference voltage node,
each of said functional circuitry and said retention voltage generation circuitry comprising at least one p-type threshold device and at least one n-type threshold device, said p-type threshold devices and said n-type threshold devices respectively having a characteristic threshold voltage,
wherein said at least one p-type threshold device and said at least one n-type threshold device in said retention voltage generation circuitry are connected in parallel between said supply voltage node and said retention voltage node,
wherein a variation in said characteristic threshold voltage of either said at least one p-type threshold device or said at least one n-type threshold device in said functional circuitry, is accompanied by a corresponding variation in said characteristic threshold voltage of either said at least one p-type threshold device or said at least one n-type threshold device respectively in said retention voltage generation circuitry, thus maintaining at least said minimum voltage between said retention voltage node and said reference voltage node and thus keeping said functional circuitry in said data retention state.

2. An integrated circuit as claimed in claim 1, wherein said variation in said characteristic threshold voltage of either said at least one p-type threshold device or said at least one n-type threshold device in said functional circuitry results in an increase in leakage current in said functional circuitry,
and said corresponding variation in said characteristic threshold voltage of either said at least one p-type threshold device or said at least one n-type threshold device respectively in said retention voltage generation circuitry results in an increase in current through said retention voltage generation circuitry.

3. An integrated circuit as claimed in claim 1, wherein said supply voltage node is at a higher voltage than said reference voltage node.

4. An integrated circuit as claimed in claim 1, wherein said supply voltage node is at a lower voltage than said reference voltage node.

5. An integrated circuit as claimed in claim 1, wherein said variation in said characteristic threshold voltage results from variations in a manufacturing process of said integrated circuit.

6. An integrated circuit as claimed in claim 1, wherein said variation in said characteristic threshold voltage results from temperature variations of said integrated circuit.

7. An integrated circuit as claimed in claim 1, wherein said at least one p-type threshold device and said at least one n-type threshold device in said retention voltage generation circuitry are p-type and n-type diodes respectively.

8. An integrated circuit as claimed in claim 7, wherein said p-type and n-type diodes comprise p-type and n-type transistors with their gates coupled to their drains.

9. An integrated circuit as claimed in claim 1, wherein said p-type threshold devices are PMOS threshold devices and said n-type threshold devices are NMOS threshold devices.

10. An integrated circuit as claimed in claim 9, wherein said PMOS threshold devices are PMOS transistors and said NMOS threshold devices are NMOS transistors.

11. An integrated circuit as claimed in claim 1, wherein said variation in said characteristic threshold voltage of either said at least one p-type threshold device or said at least one n-type threshold device comprises an upwards variation in said characteristic threshold voltage of said at least one p-type threshold device and a downwards variation in said characteristic threshold voltage of said at least one n-type threshold device.

12. An integrated circuit as claimed in claim 1, wherein said variation in said characteristic threshold voltage of either said at least one p-type threshold device or said at least one n-type threshold device comprises an upwards variation in said characteristic threshold voltage of said at least one n-type threshold device and a downwards variation in said characteristic threshold voltage of said at least one p-type threshold device.

13. An integrated circuit as claimed in claim 1, wherein said functional circuitry comprises a memory.

14. An integrated circuit as claimed in claim 13, wherein said at least one p-type threshold device and at least one n-type threshold device in said functional circuitry form part of a memory bitcell.

15. An integrated circuit as claimed in claim 13, wherein said memory is a RAM.

16. An integrated circuit as claimed in claim 1, wherein said retention voltage generation circuitry comprises a plurality of pairs of p-type and n-type threshold devices connected in parallel between said supply voltage node and said retention voltage node.

17. An integrated circuit as claimed in claim 1, wherein said p-type threshold devices and said n-type threshold devices in said functional circuitry and said retention voltage generation circuitry are similarly sized devices.

18. An integrated circuit as claimed in claim 1, wherein said functional circuitry comprises a retention flip-flop.

19. An integrated circuit as claimed in claim 1, wherein said functional circuitry comprises a retention latch.

20. A computer-readable storage medium storing in a non-transient format a library configured to provide an integrated circuit as claimed in claim 1.

21. An integrated circuit comprising:
a supply voltage node and a retention voltage node;
retention voltage generation means for receiving a supply voltage from said supply voltage node and for providing a retention voltage at said retention voltage node; and
functional circuitry means connected between said retention voltage node and a reference voltage node, said functional circuitry means configured to be held in a data retention state when at least a minimum voltage is provided between said retention voltage node and said reference voltage node,
each of said functional circuitry means and said retention voltage generation means comprising at least one p-type threshold device and at least one n-type threshold device, said p-type threshold devices and said n-type threshold devices respectively having a characteristic threshold voltage,
wherein said at least one p-type threshold device and said at least one n-type threshold device in said retention voltage generation circuitry are connected in parallel between said supply voltage node and said retention voltage node,
wherein a variation in said characteristic threshold voltage of either said at least one p-type threshold device or said at least one n-type threshold device in said functional circuitry means, is accompanied by a corresponding variation in said characteristic threshold voltage of either said at least one p-type threshold device or said at least one n-type threshold device respectively in said retention voltage generation means, thus maintaining at least said minimum voltage between said retention voltage node and said reference voltage node and thus keeping said functional circuitry means in said data retention state.

22. A method of supplying a retention voltage to functional circuitry in an integrated circuit, said integrated circuit comprising a supply voltage node and a retention voltage node, said method comprising the steps of:
providing retention voltage generation circuitry configured receive a supply voltage from said supply voltage node and to provide a retention voltage at said retention voltage node;
providing functional circuitry connected between said retention voltage node and a reference voltage node, said functional circuitry configured to be held in a data retention state when at least a minimum voltage is provided between said retention voltage node and said reference voltage node,
each of said functional circuitry and said retention voltage generation circuitry comprising at least one p-type threshold device and at least one n-type threshold device, said p-type threshold devices and said n-type threshold devices respectively having a characteristic threshold voltage; and
connecting said at least one p-type threshold device and said at least one n-type threshold device in said retention voltage generation circuitry in parallel between said supply voltage node and said retention voltage node,
wherein a variation in said characteristic threshold voltage of either said at least one p-type threshold device or said at least one n-type threshold device in said functional circuitry, is accompanied by a corresponding variation in said characteristic threshold voltage of said at least one p-type threshold device or said at least one n-type threshold device respectively in said retention voltage generation circuitry, thus maintaining at least said minimum voltage between said retention voltage node and said reference voltage node and thus keeping said functional circuitry in said data retention state.

23. A computer-readable storage medium storing in a non-transient format a computer program configured to cause a computer to carry out the method of claim 22.

* * * * *